United States Patent [19]
Chen et al.

[11] Patent Number: 5,256,505
[45] Date of Patent: Oct. 26, 1993

[54] LITHOGRAPHICAL MASK FOR CONTROLLING THE DIMENSIONS OF RESIST PATTERNS

[75] Inventors: Jang F. Chen, San Jose; James A. Matthews, Milpitas, both of Calif.

[73] Assignee: Microunity Systems Engineering, Sunnyvale, Calif.

[21] Appl. No.: 933,393

[22] Filed: Aug. 21, 1992

[51] Int. Cl.$^5$ ............................................. G03F 9/00
[52] U.S. Cl. ........................................ 430/5; 378/35; 364/474.24
[58] Field of Search .............................. 430/5; 378/35; 364/474.24

[56] References Cited
U.S. PATENT DOCUMENTS 4,895,780  1/1990  Nissan-Cohen et al. ................ 430/5

*Primary Examiner*—Marion E. McCamish
*Assistant Examiner*—Mark A. Chapman

[57] ABSTRACT

A mask for transferring square and rectangular features having critical dimensions (CDs) close to the resolution limit of the exposure tool utilized to perform the transference is described. Intensity modulation lines having the opposite transparency as the rectangular feature to be transferred, and a width significantly less than the resolution of the exposure tool, are disposed within the rectangular feature. The intensity modulation lines have the affect of damping intensity levels on the resist layer in the center of the rectangular feature. As a result, the final CD measurement of the rectangular feature is within the CD tolerance of the original designed CD measurement. In addition, since modulation lines are have dimensions well below the resolution limit of the exposure tool, they are not seen in the final rectangular resist pattern.

10 Claims, 4 Drawing Sheets

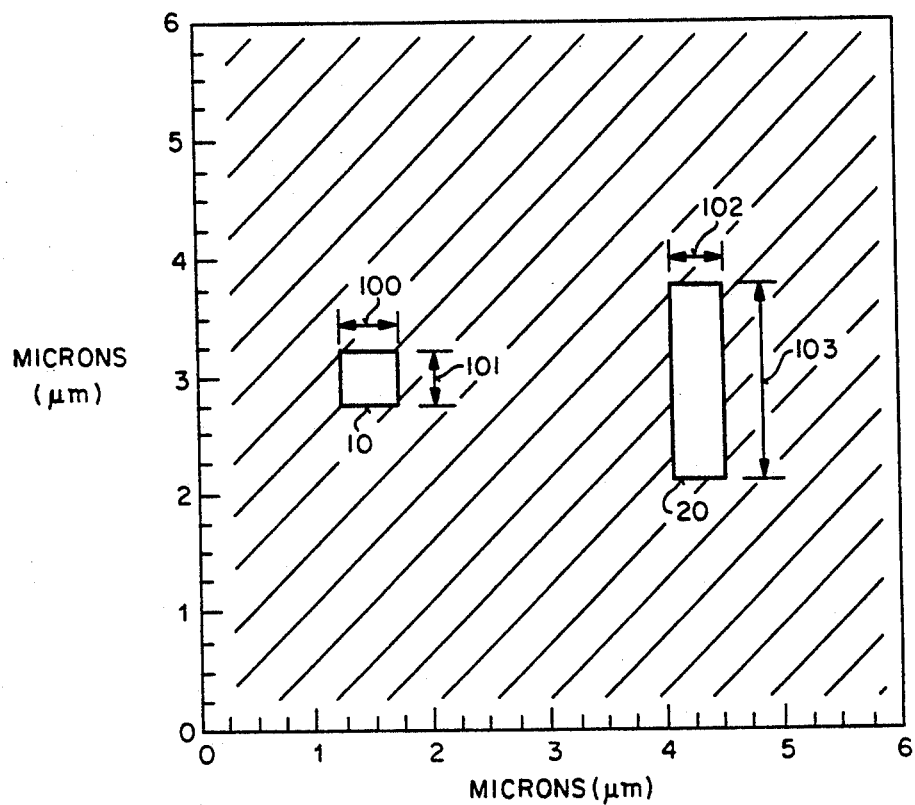
FIG_1A
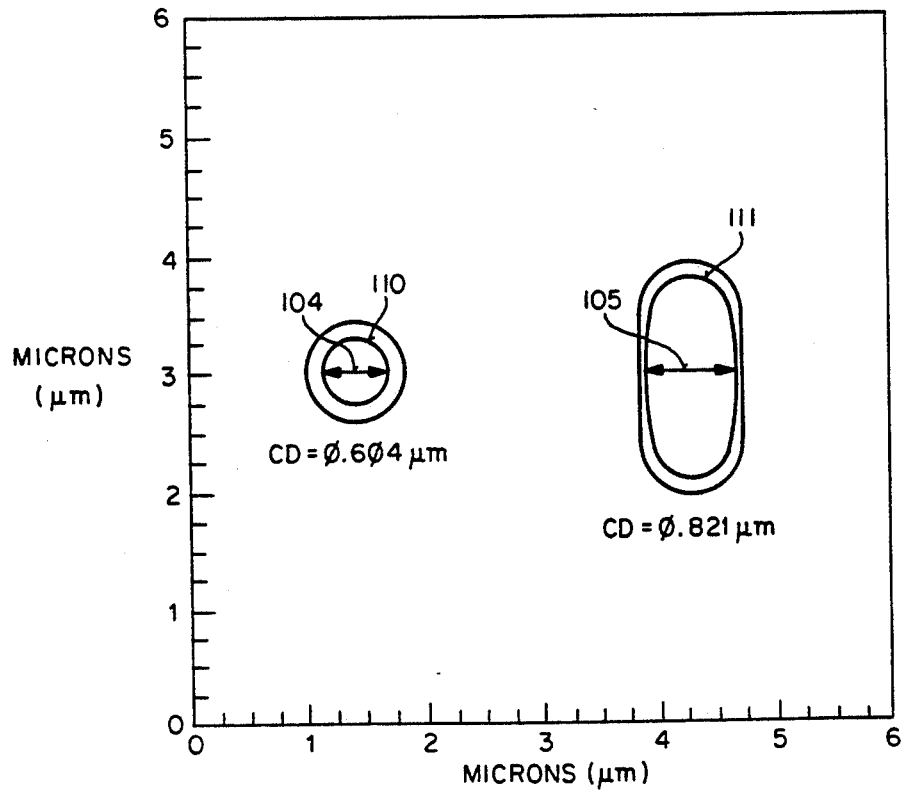
FIG_1B

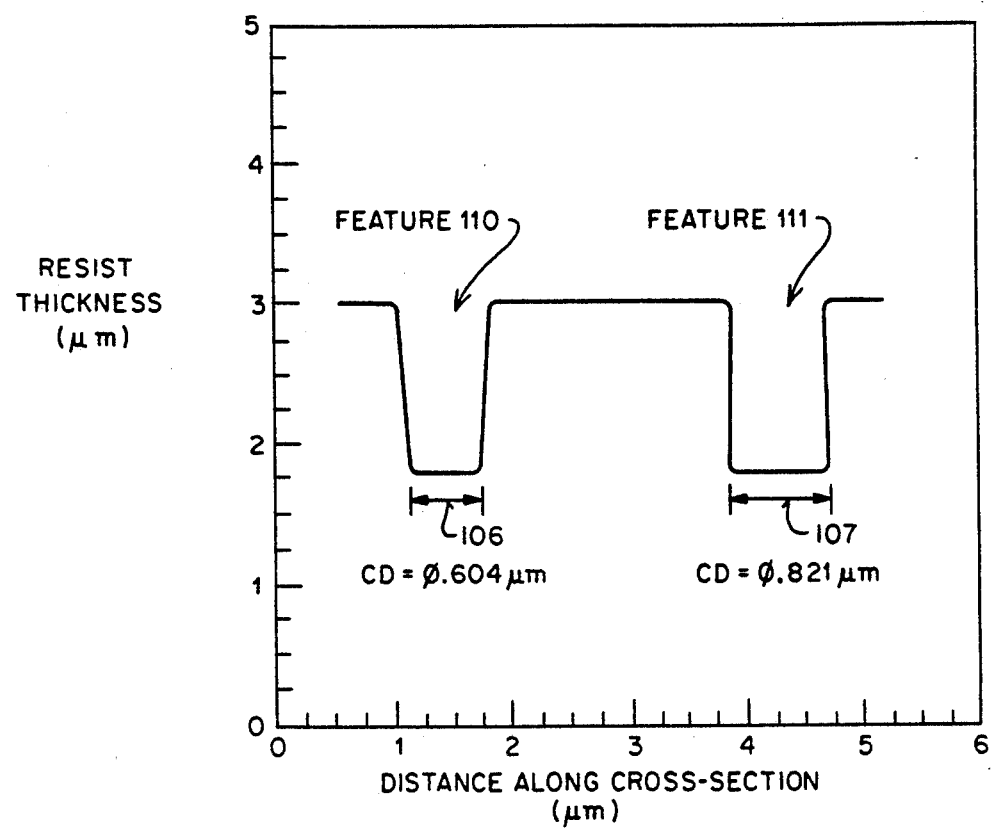
FIG_1C
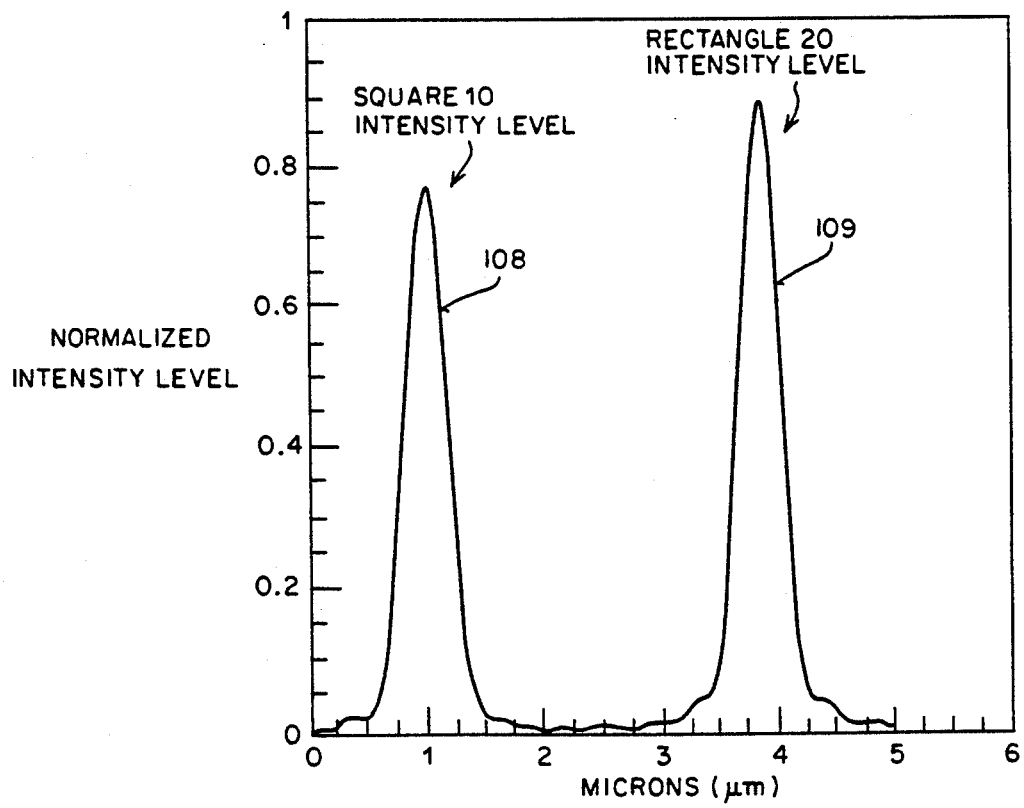
FIG_1D

FIG _ 2A
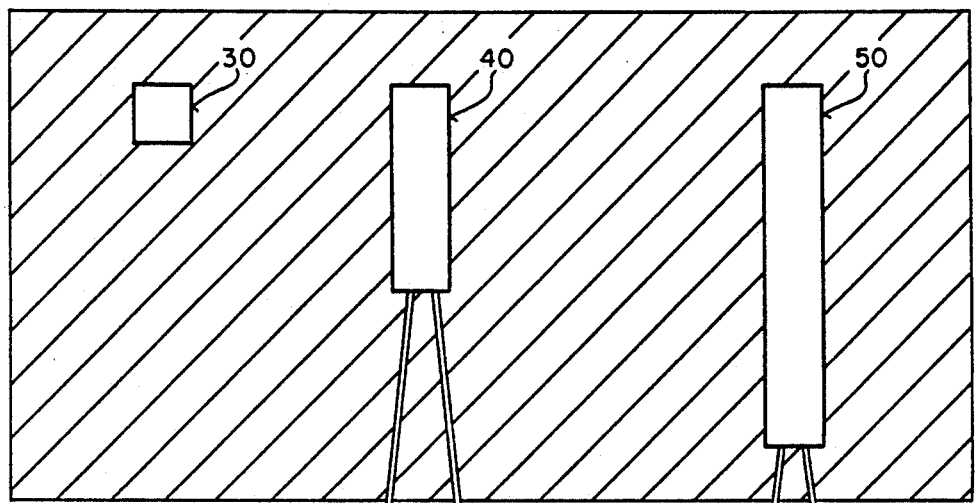
FIG 2B
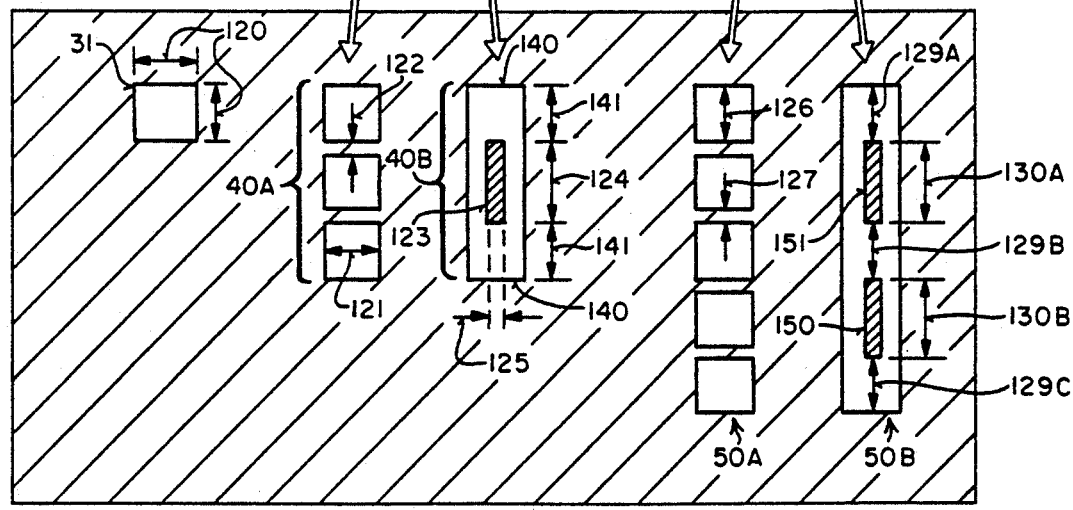

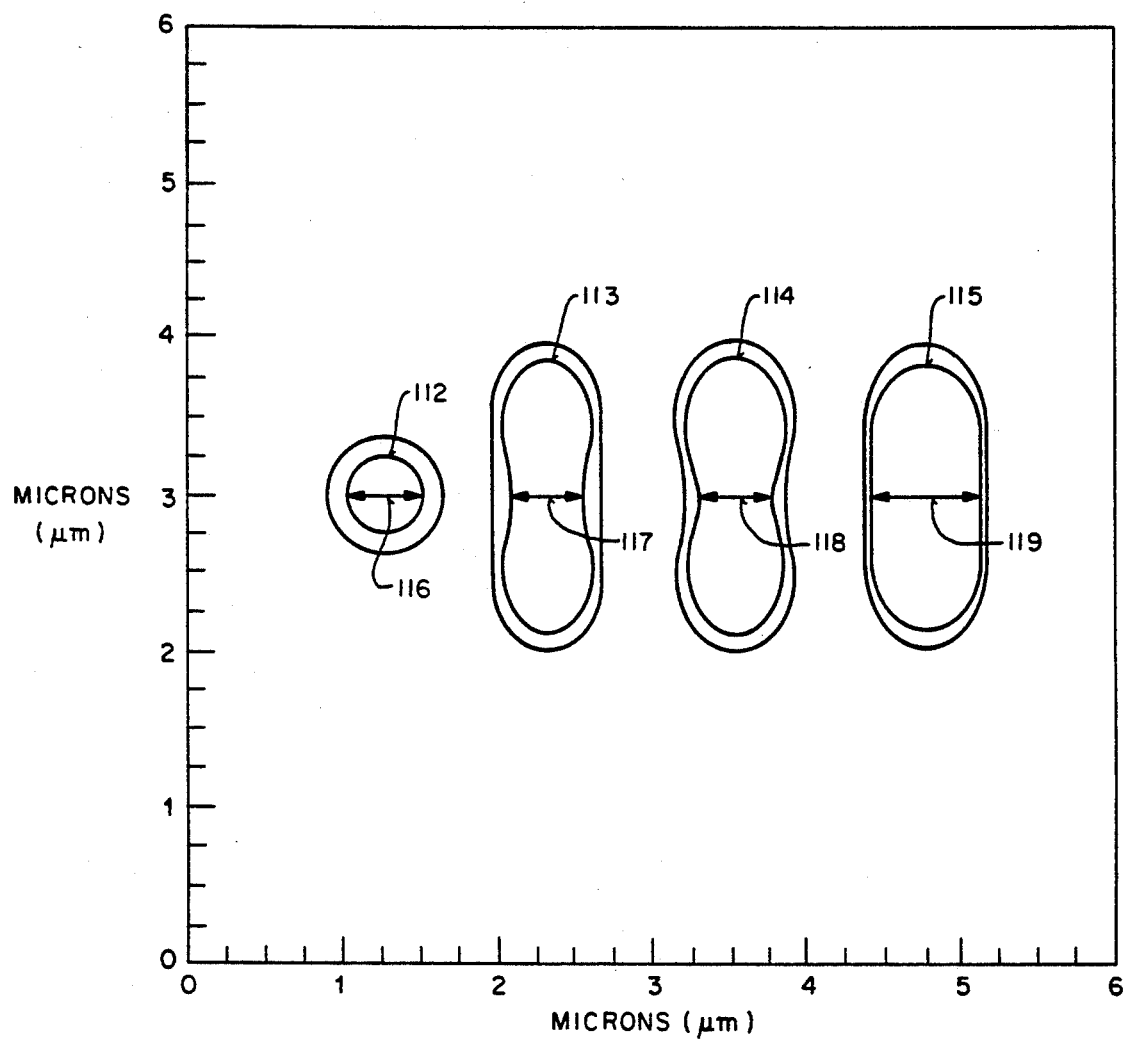
FIG _ 3
TOP VIEWS OF CONTACT PATTERNS

LITHOGRAPHICAL MASK FOR CONTROLLING THE DIMENSIONS OF RESIST PATTERNS

FIELD OF THE INVENTION

The present invention relates to the field of processing of semiconductor devices, and particularly to photolithographic methods of transferring patterns onto the surface of a silicon substrate.

RELATE U.S. PATENT APPLICATIONS

U.S. patent application Ser. No. 07/863,791, filed Apr. 6, 1992 entitled, "Method for Improved Lithographic Patterning in a Semiconductor Fabrication Process" and U.S. patent application Ser. No. 07/821,793, filed Jan. 16, 1992 entitled, "Improved Mask for Lithography".

BACKGROUND OF THE INVENTION

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, or layout, which itself can then be transferred onto the silicon surface. Again, computer aided design (CAD) tools assist layout designers in the task of translating the discrete circuit elements into shapes which will embody the devices themselves in the completed IC. These shapes make up the individual components of the circuit, such as gate electrodes, field oxidation regions, diffusion regions, metal interconnections, and so on. The software programs employed by these CAD systems are usually structured to function under a set of predetermined design rules in order to produce a functional circuit. Often, these rules are determined by certain processing and design limitations. For example, design rules defining the space tolerance between devices or interconnect lines so as to ensure that the devices or lines do not interact with one another in any unwanted manner.

Design rule limitations are frequently referred to as critical dimensions. A critical dimension of a circuit is commonly defined as the smallest width of a line or the smallest space between two lines. Consequently, the critical dimension determines the overall size and density of the IC. In present IC technology, the smallest critical dimension for state-of-the-art circuits is 0.5 microns for line widths and spacings.

Once the layout of the circuit has been created, the next step to manufacturing the integrated circuit (IC) is to transfer the layout onto a semiconductor substrate. Photolithography is a well known process for transferring geometric shapes present on a mask onto the surface of a silicon wafer. In the field of IC lithographic processing a photosensitive polymer film called photoresist is normally applied to a silicon substrate wafer and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

Commonly, when transferring a pattern to a semiconductor substrate, a lithographic mask may have a pattern with various sizes and shapes. For example, a contact mask may require both square and rectangular openings. Contact masks are employed to form the openings in layers, (typically protective glass layers), to allow contact to underlying devices or metal lines. In the formation of a contact over a device or metal line, more consideration is placed on the aspect of the area being opened rather than the sharp corners or straight lines of the contact opening. The reason for this is because the most important function of a contact is to make reliable contact to the underlying layer or device. Specifically, if a contact is too small, i.e. not a large enough opening to the underlying device, insufficient electrical contact may occur. Conversely, if the contact opening is too large, i.e. covers too much area, shorts may occur due to overlapping of contacts and other electrical lines.

Rectangular shaped contacts offer several advantages to IC fabrication. First, a rectangular contact generally covers a larger area as compared to a square contact having similar dimensions. Since the size of a contact opening is inversely related to its associated contact resistance, a larger rectangular contact will have lower contact resistance than a smaller square contact. Lower contact resistance reduces power consumption and thus overall power consumption of the IC. In addition, a contact having lower resistance is preferable because it is less prone to the effects of electromigration.

Electromigration occurs in metal lines and contacts operating with high current densities at elevated temperatures. In time, electrons in the high current density contacts and lines may cause metal atoms to migrate. If enough metal atoms are displaced, open circuits may occur. Hence, the long-term reliability of an IC may be adversely affected if contacts are too small with respect to their associated current density. So, in the case where high current densities are a concern, it may be desirable to utilize rectangular contact openings in addition to square contact openings.

However, it has been found that problems occur when lithographically transferring square and rectangular shapes on the same mask if the critical dimensions of the shapes approach the resolution limit of the exposure tool. The resolution for an exposure tool is defined as the minimum feature that the exposure tool can repeatedly expose onto the wafer. Currently, the resolution for most advanced optical exposure tools is around 0.5 micron. Also, as stated above, current state-of-the-art IC circuits are being designed with critical dimensions equal to 0.5 microns. Consequently, the problem of printing rectangular and square shapes on the same mask is a prevalent problem.

For example, if the pattern of a square having 0.5 micron sides and a rectangle having a 0.5 micron width is transferred from a mask onto a resist layer, (utilizing an exposure tool having 0.5 micron resolution limit), the center portion of the rectangle transfers relatively wider than, and out tolerance of, the originally designed 0.5 micron rectangle mask width. This is true if the energy setting of the exposure tool is set to ensure that the 0.5 micron square feature transfers to the resist layer within tolerance. The energy setting to ensure that a feature transfers within CD tolerances is referred to as the nominal energy ($E_n$) for that particular feature.

However, if the energy level of the exposure tool is set to the $E_n$ of the 0.5 micron rectangle, the 0.5 micron rectangle will be transferred within CD tolerances, but the 0.5×0.5 micron square shape will be underexposed.

In other words, the optimum energy setting to expose a rectangular shape in much less than that of a square shape when the critical dimensions of the shapes approach the resolution limit of the exposure tool.

The reason for the difference in exposure results is that the intensity level measured on the resist for the different shapes is not the same as when the shapes are exposed at the same time utilizing an exposure tool set at a certain energy level. As a result, if a mask pattern containing a rectangle and square are simultaneously transferred to a resist layer, only one of the features is optimally transferred.

An inability to control final resist CDs of contact patterns can result in short circuits due to over exposed rectangular contact openings. Conversely, contact openings may not even be formed due to underexposed square contact openings. Therefore, a method is needed to ensure that the final CDs of all of the shapes within a pattern on a photoresist layer are consistent with the CDs on the original mask regardless of shape.

The most obvious way to avoid this phenomena is to relax the design rules of the circuit such that the CDs are not at the resolution limit of the exposure tool. However, increasing CDs, yields larger die sizes. Larger die and circuit sizes have many undesirable characteristics such as high defect densities and slower circuit speeds. Also, not utilizing the exposure tool to its fullest capabilities is not a cost effective practice.

Pre-biasing mask patterns is another way of overcoming this problem. The original square and rectangle contact mask pattern may be adjusted such that the CDs of the square contacts are increased and the energy of the exposure tool is set at the En of the rectangular shape. This method utilizes the fact that when the dimensions of a square shaped contact is increased, its associated En is decreased. Therefore the size of the square contact can be increased until its En approximately matches the En of the rectangle. The final CDs of both shapes in the photoresist layer are then closer to the original masked CDs. However, the process of trying to increase the square contact size and adjust energy levels is mainly a trial-and-error exercise and is extremely process dependent. Therefore, this method is generally more effective when applied to a somewhat stable processes.

The lithographical mask of the present invention overcomes the problem of transferring square and rectangular shapes by reducing the intensity level on the resist layer of the rectangular shape. As mentioned above, the intensity level measured on a resist layer is much higher in the center of a rectangle than that of the square when exposed to the same radiant source. This results in an overexposure of the center of the rectangle. By altering the mask pattern of the rectangular shape, the intensity level of the center of the rectangle can be modulated thereby eliminating the overexposure problem. The effect of the intensity modulation is to make it possible to transfer both square and rectangle shapes utilizing the same exposure tool and energy level while retaining the same CDs for both shapes.

SUMMARY OF THE INVENTION

A lithographical mask for transferring square and rectangle patterns from a mask to a semiconductor substrate is described.

When critical dimensions (CDs) of shapes on a mask approach the resolution limits of the exposure tool being utilized, specific shapes may not transfer the same as or within tolerance of the original mask CDs. This is due to a difference in required nominal energy (En) for different shapes. Specifically, in a mask pattern having both rectangular and square features, the width of the middle of the resist pattern for the rectangular features will be larger than the original designed mask width, (when utilizing an exposure tool having an energy equal to the En for the square shape). The reason for this is that the intensity level for the rectangle is much higher in its center than the intensity level of the square. This difference in intensity levels results in distortion (overexposure) of the center of the rectangle.

According to the present invention the intensity levels for specific features within a mask pattern are reduced by adding lines, referred to as intensity modulation lines, within the features needing modulation. The modulation lines are of the opposite transparency of the original feature and have dimensions less than the resolution of the exposure tool. Because the additional features are smaller than the resolution of the exposure tool, they do not transfer onto the resist layer. Instead, the additional intensity modulation features have the effect of dimming the intensity level in the center of the feature being modulated. Modulating the intensity levels of specific shapes within a mask pattern having varying shaped features (and Ens) allows simultaneous transference of these shapes while utilizing one energy setting.

In one embodiment of the present invention a rectangular shape having a certain transparency is modulated by adding an intensity modulation line (having the opposite transparency) to the center of the rectangular feature. The bar has a width that is equal to one fifth (1/5) of the CD of the square feature being transferred along with the rectangle. For optimum intensity modulation, the distance from the ends of the intensity modulation bar and the ends of the rectangle is approximately equal to the CD of the square contact. In addition, the optimum length of the bar is less than 1.4 times the square CD.

In another embodiment of the present invention, the rectangular shape to be modulated is dissected into squares having the same dimensions as the square feature that is to be transferred with it. For optimum intensity modulation, the distance between each square is equal to 1/5 the CD of the square.

The present invention is also applicable to all forms of photolithographic processes such as optical lithography, laser based deep UV lithography, non-laser based deep UV lithography, x-ray lithography, and particle beam based lithography.

BRIEF DESCRIPTION OF THE DRAWINGS

FIG. 1A is the mask test pattern showing square and rectangular featured.

FIG. 1B illustrates the resist patterns for square and rectangular features for the mask shown in FIG. 1A.

FIG. 1C shows a cross sectional view of the contact opening formed by the mask utilized in FIG. 1A.

FIG. 1D is a graph illustrating the intensity levels measured on the resist layer for the square and rectangular features in the mask shown in FIG. 1A.

FIG. 2A is the mask test pattern having a square feature and two rectangular features without the intensity modulation lines of the present invention.

FIG. 2B is a mask test pattern which shows the rectangular features of FIG. 2A having intensity modulation lines as described in the present invention.

FIG. 3 shows the resist patterns for a square feature and for rectangular features with and without intensity modulation lines as described by the present invention.

DETAILED DESCRIPTION

A means for controlling dimensions of resist patterns through intensity modulation is disclosed. In the following description, numerous specific details are set forth, such as energy settings, line width dimensions, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

FIG. 1A shows a mask test pattern having a square feature 10 and a rectangular feature 20. Square feature 10 has sides 100 and 101 which are approximately equal to 0.5 microns. The width, side 102, of rectangle 20 is approximately 0.5 microns and its length, side 103, is approximately 1.7 microns. Hence, the critical dimension (CD) for both the rectangle and square is 0.5 microns.

FIG. 1B shows the top view of the final resist patterns for the test pattern as shown in FIG. 1A. A commercially available exposure tool, Canon 2000i 5× stepper, is utilized to expose the pattern in FIG. 1A onto a KTI095i resist layer. The resolution of the exposure tool is near 0.5 microns and is consequently the same as the CDs for square 10 and rectangle 20 in FIG. 1A. The exposure energy is set at approximately 20% above the En for square 10. This exposure energy setting is chosen to illustrate how the CD measurement problems described above are further exacerbated when exposure energies are out of tolerance by 20%.

All CD measurements are taken at the bottom of the resist contact patterns and in the center portion of the contact. Consequently, as indicated in FIG. 1B by lines 104 and 105, CD measurements are taken approximately in the center of features 110 and 111 and as shown in FIG. 1C, lines 106 and 107, at the bottom of features 110 and 111.

As can be seen in FIG. 1B, the final shapes of features 110 and 111 no longer resemble the original square 10 and rectangle 20 patterns as illustrated in FIG. 1A. This is mainly due to diffraction effects and the exposure tools inability to resolve the corner portions of the square and rectangle features. However, this type of distortion for contact mask features is acceptable, since the main concern in forming contact openings is the area opened and not the sharp edges of the contact feature. Consequently, the final CD measurement of the square and rectangular features, particularly the CD measurements taken at their centers, becomes the determining factor of an acceptable contact opening.

The CD measurement for final resist square feature 110, taken at line 104, is 0.604 microns. Hence, the final resist CD measurement for square 10 represents a 20% variation from the original 0.5 micron CD. This is to be expected since the exposure energy setting was set to 20% above the En for the square. However, the final CD measurement for rectangle 111, taken at line 105, is 0.821 microns. This indicates a 64% difference from the original 0.5 micron CD. Obviously, a contact opening that is 64% larger than designed is unacceptable.

The reason for the difference in the way in which the square and the rectangle transfer to the resist is illustrated in the intensity level profiles measured on the resist layer for each feature. FIG. 1D shows the intensity level profiles of square 10 and rectangle 20 shown in FIG. 1A, taken at the center of both feature. As can be seen, the intensity level of the center of the square contact, line 108, is much less than the intensity level of the center of the rectangular contact, line 109. The difference in intensity levels results in a significant difference in the final resist CDs at the center of each feature, as seen in FIG. 1B.

The present invention addresses the problems inherent in transferring features of assorted shapes and sizes (like the square and rectangle pattern of FIG. 1A) by matching the intensity levels on the resist layer for each feature. This is achieved by adding lines, referred to as intensity modulation lines within the features to be modulated, to the normal mask pattern. The intensity modulation lines have the opposite transparency as the original feature, and have the effect of "dimming" the excessive intensity level in the larger features.

Unlike process dependent prior art solutions to transferring square and rectangular features, the present invention offers a solution which is dependent on the critical dimension value for the circuit being designed and is therefore process independent. Thus, the present invention can easily be adjusted to accommodate circuit designs with any CD. In addition, CDs can be kept close to or at the resolution limit of the exposure tool.

The main concept of the present invention is to reduce the intensity levels in the center of features by adding intensity modulation lines within such features. Consequently, the specific shapes and spacing of intensity modulation lines as described below need not be employed to practice the present invention. Instead these specific guidelines offer an optimum condition in which the present invention operates to alleviate problems associated with square and rectangular contact mask patterns.

FIG. 2A shows a mask test pattern having three features, square 30, rectangle 40, and elongated rectangle 50. Features 30, 40, and 50 are all designed to have CDs approximately equal to each other and the resolution limit of the exposure tool utilized to transfer the features to a resist pattern. FIG. 2B shows a corresponding modified mask test pattern having features 31, 40A, 40B, 50A and 50B. Features 40A, 40B, 50A, and 50B have intensity modulation lines as disclosed in the present invention.

Feature 30 in FIG. 2A has the same dimension of feature 31 in FIG. 2B since no intensity modulation is required. The reason for this is because the exposure tool to be utilized to transfer the square and rectangle contact mask is set at an exposure energy equal to the nominal energy setting for the square feature.

Feature 40A and 40B in FIG. 2B are two embodiments of the present invention for intensity modification of feature 40 in FIG. 2A. The length and width of features 40A and 40B are the same as that of feature 40. Feature 50A and 50B in FIG. 2B are two embodiments of the present invention for intensity modification of feature 50 in FIG. 2A. The length and width of features 50A and 50B are the same as that of feature 50.

In a first embodiment of the present invention, intensity modulation lines essentially dissect feature 40, FIG. 2A, into three squares. Feature 40A in FIG. 2B, is comprised of three squares, each square having the same dimensions as the single square contact 31. Thus, dimension 120 of square 31 is the same as dimension 121 of feature 40A. The three squares of feature 40A are spaced a distance of one fifth (1/5) of dimension 120, as indicated by dimension 122.

As a first example of this first embodiment, when transferring a 0.5×0.5 micron square and a 0.5×1.7 micron rectangle with an exposure tool having a resolution limit near 0.5 microns, the rectangular feature is modified such that it consists of three 0.5×0.5 micron squares which are spaced apart by 0.1 micron spaces (having the opposite transparency of the three squares). Since the squares are spaced apart a distance less than the resolution of the exposure tool, the spaces between the squares are not transferred to the resist layer. Instead, the effect of the 0.1 micron modulation lines is to reduce the intensity level of the rectangular feature on the exposed resist layer.

FIG. 2B, feature 50A, shows a second example of the of the first embodiment of the present invention. The concept of the first embodiment is to dissect the elongated rectangle into as many squares having the same dimensions as the square contact 31 and spacing the squares a distance of 1/5 of dimension 120. Hence, dimensions 126 and 127 of feature 50A are the same as dimensions 121 and 122 of feature 40A. As an example, if elongated rectangle 50 in FIG. 2A is a 0.5×2.9 micron rectangle, it would be divided into five 0.5×0.5 micron squares being spaced apart by 0.1 micron modulation lines as shown in feature 50A, FIG. 2B.

Feature 40B in FIG. 2B is the second embodiment of the present invention for intensity modification of feature 40 in FIG. 2A. Feature 40B places the intensity modulation line 123 (having the opposite transparency as the rest of the feature) in the center of the rectangle. The optimum width of line 123 is 1/5 of dimension 120 of square 31. It is also preferable to place intensity modulation line 123 a distance equal to dimension 120 from each end of rectangle 40B, (the ends of rectangle 40B being indicated by lines 140). In other words, the distance indicated by lines 141 for feature 40B, is optimally equal to dimension 120 of square 31. The length of modulation line 123, (indicated by line 124), can vary but optimally is shorter than 1.4 times dimension 120.

As an example of this second embodiment, when transferring a 0.5×0.5 micron square and a 0.5×1.7 micron rectangle with an exposure tool having a resolution limit near 0.5 microns, the intensity modified rectangle mask feature would be comprised of a 0.5×1.7 micron rectangle having a 0.1×0.7 micron intensity modulation line (having the opposite transparency as the rectangle) centered within in. The modulation line is spaced a distance of 0.5 microns from each end of the rectangle. Since the modulation line is a width less than the resolution of the exposure tool, it is not transferred to the resist layer. Instead, the effect of the modulation line is to reduce the intensity level of the feature on the exposed resist layer.

Of course not all rectangles can be dissected into an equal number of squares having the same dimensions as its associated square contact. Thus, if the first embodiment of the present invention is utilized to transfer a 0.5×1.9 micron rectangle, there are 0.2 microns of contact length that is not accounted for. In addition, if the embodiment shown in feature 40B is utilized to transfer the 0.5×1.9 micron rectangle, the optimum placement of the modulation line is 0.5 microns from each end of the rectangle. As a result, the modulation line would have to be a length of 0.9 microns. However, as mentioned above, it is preferable that the modulation line be less than 1.4 times dimension 120 which is equal to 0.7 microns.

Therefore, in this situation, the embodiment shown in feature 50B, FIG. 2B, is more applicable. The reason for this is that in the second embodiment of the present invention the spacing between the modulation lines and between the ends of the rectangle (feature 40B dimension 141) is more crucial than the length of modulation line 123. Consequently, the length of the modulation lines may vary. For example, if feature 50B is 0.5×1.9 microns, intensity modulation can be achieved by adding two intensity modulation lines 150 and 151 within rectangle 50B. The distances 129A, 129B, and 129C are all optimally equal to dimension 120; which for this example is 0.5 microns each. The modulation lines 150 and 151 are approximately 0.2 microns long, as indicated by dimensions 130A and 130B. The width of lines 150 and 151 are optimally 1/5 dimension 120, or for the example, 0.1 micron. If the length of the rectangle to be modulated is longer than 1.9 microns, the spacing between the bars, dimensions 129A-129C should remain the same, but lines 150 and 151 may be lengthen. However, lines 150 and 151 should preferably remain less than 1.4 times dimension 120.

FIG. 3 shows the resist patterns for 0.5×0.5 micron square 112, a 0.5×1.7 micron unmodulated rectangular 115, a 0.5×1.7 micron modulated rectangular feature 113 corresponding to feature 46A, FIG. 2B, and a 0.5×1.7 micron modulated rectangular feature 114 corresponding to feature 40B, FIG. 2B. Lines 116, 117, 118, and 119 indicate where CD measurements are taken for features 112, 113, 114, and 115 respectively.

Table 1 gives the final resist CD measurements taken at 116, 117, 118, and 119. A commercially available exposure tool, Canon 2000i 5× stepper, was utilized to expose the patterns onto a KT1895i resist layer. The resolution of the exposure tool is approximately 0.5 microns and its exposure energy was set at 260 mJoules. All CD measurements are taken at the bottom of the resist contact patterns and in the center portion of the contact, as described previously. The % delta shown in Table 1 gives the % difference between the final resist CD measurement and the original designed CD measurement for each feature.

TABLE 1

| Feature (FIG. 3) | Dimension (microns) | Cross-sectional CD (microns) | % Delta |
|---|---|---|---|
| square 112 | 0.5 × 0.5 | CD 116 = 0.475 | 5.0% |
| rectangle 113 | 0.5 × 1.70 | CD 117 = 0.515 | 3.0% |
| rectangle 114 | 0.5 × 1.70 | CD 118 = 0.482 | 3.6% |
| rectangle 115 | 0.5 × 1.70 | CD 119 = 0.755 | 50.0% |

As can be seen, unmodulated rectangular feature 115 has a CD measurement which is 50% different than the 0.5 micron designed CD. In the field of integrated circuit design, lithographical CD tolerances for contact openings typically are ±20%. However, in many applications, CD tolerances may be as low as ±10%. Thus, the final resist pattern of feature 115 exceeds the preferred ±20% CD tolerance. In contrast, rectangles 113 and 114 both have CD differences equal to 3% and 3.6% respectively, which is well within a 20% CD tolerance. As can be seen the intensity modulation lines as described by the present invention significantly improve CD values for the rectangular feature. Table also gives CD measurements for square 112. As indicated in Table 1 the % delta for square 112 is 5%. Therefore, the % delta of intensity modulated rectangles 113 and 114 even out perform the % delta of square 112.

Although the present invention has been described in conjunction with certain embodiments, it is appreciated that the invention may be implemented in a variety of other ways. By way of example, the concept of the present invention is not strictly limited to semiconductor processes; it can be applied to any photolithographic processes. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

We claim:

1. A mask for optically transferring a lithographic pattern onto a semiconductor substrate by exposing a layer of radiation sensitive material disposed on said semiconductor through said mask by a radiation source, said pattern including at least one feature having an associated intensity level on said layer of radiation sensitive material for a corresponding energy level of said radiation source, said mask comprising:

at least one intensity modulating feature disposed within said at least one feature, having the opposite transparency of said at least one feature and having a dimension sufficiently small so as not to be transferred onto said substrate, said at least one intensity modulating feature altering the intensity level on said layer of radiation sensitive material for said at least one feature.

2. The mask as described in claim 1 wherein said at least one feature comprises a first rectilinear feature having an associated critical dimension and said at least one intensity modulating feature comprises a similar smaller second rectilinear feature disposed substantially in the center of said first rectilinear feature.

3. The mask as described in claim 2 wherein the width of said second rectangular feature is less than the associated resolution limit of said radiation source.

4. A mask for optically transferring a lithographic pattern onto a semiconductor substrate by exposing a layer of radiation sensitive material disposed on said semiconductor through said mask by a radiation source, said radiation source having an associated resolution limit, said pattern including first and second features each having an associated minimum dimension approximately equal to said resolution limit, said first feature having a first associated intensity level on said layer of radiation sensitive material for a corresponding energy level of said radiation source and said second feature having a second associated intensity level on said layer of radiation sensitive material for said corresponding energy level of said radiation source, wherein said pattern of said second feature is distorted due to its associated second intensity level, said mask comprising:

at least one intensity modulating feature disposed on said mask within said second feature, said at least one intensity modulating feature having the opposite transparency of said second feature and having dimensions sufficiently small so as not to be transferred onto said substrate, said at least one intensity modulating feature for altering said second intensity level of said second feature to approximate said first intensity level of said first feature.

5. The mask as described in claim 4 wherein said at least one intensity modulating feature dissects said second feature into a plurality of sub-features having similar dimensions as said first feature.

6. The mask as described in claim 5 wherein said first feature comprises a square and said second feature comprises a rectangle and said plurality of sub-features comprise a plurality of squares having the same dimensions as said first feature, said sub-features being spaced a distance approximately equal to one-fifth of said associated minimum dimension.

7. The mask as described in claim 4 wherein said first feature comprises a square and said second feature comprises a first rectangle and wherein said at least one intensity modulating feature is disposed essentially in the center of said second feature.

8. The mask as described in claim 7 wherein said at least one intensity modulating feature is disposed a distance equal to said minimum dimension from the ends of said first rectangle and from any other intensity modulating features.

9. The mask as described in claim 8 wherein said at least one intensity modulating feature comprises a second rectangle having a length less than or equal to 1.4 times said minimum dimension and having a width approximately equal to one-fifth of said associated minimum dimension.

10. A mask for optically transferring a pattern having at least one feature from a mask onto a substrate, said pattern being transferred by exposing a radiation sensitive layer disposed on the surface of said substrate to a radiant source through said pattern, said radiant source having an associated energy level and said at least one feature having a corresponding intensity level measured on said surface of said radiation sensitive layer due to said associated energy level, wherein when the minimum dimension of said at least one feature approaches the resolution limits of the radiation source said at least one feature requires a nominal intensity level for optimum transference to said radiation sensitive layer, said mask comprising:

means for modulating said corresponding intensity level measured on said radiation sensitive layer to approximately match said nominal intensity level for said at least one feature, said intensity modulation means disposed within said at least one feature on said mask, and having the opposite transparency as said at least one feature, said intensity modulation means having dimensions such that it is not transferred onto said semiconductor substrate.

* * * * *